(12) United States Patent
Zhang et al.

(10) Patent No.: US 11,075,121 B2
(45) Date of Patent: Jul. 27, 2021

(54) SEMICONDUCTOR DEVICES AND FABRICATION METHODS THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Huanyun Zhang, Shanghai (CN); Jian Wu, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 16/558,671

(22) Filed: Sep. 3, 2019

(65) Prior Publication Data
US 2020/0105607 A1 Apr. 2, 2020

(30) Foreign Application Priority Data
Sep. 28, 2018 (CN) .......................... 201811140194.X

(51) Int. Cl.
H01L 27/088 (2006.01)
H01L 21/8234 (2006.01)
H01L 21/02 (2006.01)
H01L 21/3105 (2006.01)
H01L 29/66 (2006.01)

(52) U.S. Cl.
CPC .. *H01L 21/823431* (2013.01); *H01L 21/0217* (2013.01); *H01L 21/0228* (2013.01); *H01L 21/31053* (2013.01); *H01L 21/823481* (2013.01); *H01L 27/0886* (2013.01); *H01L 29/66545* (2013.01)

(58) Field of Classification Search
CPC ............ H01L 21/0217; H01L 21/0228; H01L 21/31053; H01L 21/823431; H01L 21/823481; H01L 27/0886
USPC ....................................................... 257/401
See application file for complete search history.

(56) References Cited

U.S. PATENT DOCUMENTS

2018/0033699 A1* 2/2018 Zhu .................. H01L 29/66795
2019/0355720 A1* 11/2019 Deng ................. H01L 29/0649

* cited by examiner

*Primary Examiner* — Brook Kebede
(74) *Attorney, Agent, or Firm* — Anova Law Group, PLLC

(57) ABSTRACT

A method for fabricating a semiconductor device includes forming an initial fin structure on a semiconductor substrate; and forming a plurality of first dummy gate structures and a second dummy gate structure across the initial fin structure. The second dummy gate structure is formed between two adjacent first dummy gate structures, and includes a second dummy-gate-structure body. The method also includes forming a trench in the initial fin structure by etching and removing the second dummy-gate-structure body and a portion of the initial fin structure under the second dummy-gate-structure body. The trench divides the initial fin structure to form two fin structures. The method further includes forming a trench isolation layer in the trench and an interlayer dielectric layer on the plurality of first dummy gate structures. The interlayer dielectric layer covers a portion of the semiconductor substrate and the two fin structures adjacent to the trench.

20 Claims, 6 Drawing Sheets

SEMICONDUCTOR DEVICES AND FABRICATION METHODS THEREOF

CROSS-REFERENCES TO RELATED APPLICATIONS

This application claims the priority of Chinese Patent Application No. CN201811140194.X, filed on Sep. 28, 2018, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

Metal-oxide-semiconductor (MOS) transistor is one of the most important components in modern integrated circuits (ICs). The basic structure of a MOS transistor includes a semiconductor substrate, a gate structure formed on the surface of the semiconductor substrate, and two source/drain doped regions respectively formed in the semiconductor substrate on the two sides of the gate structure. The gate structure includes a gate dielectric layer formed on the surface of the semiconductor substrate and a gate electrode layer formed on the surface of the gate dielectric layer.

With the development of semiconductor technology, the ability of the conventional planar MOS transistor in controlling the channel current becomes weaker, causing a severe leakage current. Fin field-effect transistor (Fin-FET) is an emerging multi-gate device, and it generally includes a fin structure protruding from the surface of a semiconductor substrate, a gate structure partially covering the top surface and the sidewalls of the fin structure, and two source/drain doped regions formed in the fin structure on the two sides of the gate structure.

However, the performance of semiconductor devices fabricated based on existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes forming an initial fin structure on a semiconductor substrate; and forming a plurality of first dummy gate structures and a second dummy gate structure across the initial fin structure. The second dummy gate structure is formed between two adjacent first dummy gate structures of the plurality of first dummy gate structures, and includes a second dummy-gate-structure body. The method also includes etching and removing the second dummy-gate-structure body and a portion of the initial fin structure under the second dummy-gate-structure body to form a trench in the initial fin structure. The trench divides the initial fin structure to form two fin structures. The method further includes forming a trench isolation layer in the trench and an interlayer dielectric layer on the plurality of first dummy gate structures. The interlayer dielectric layer covers a portion of the semiconductor substrate and the two fin structures adjacent to the trench.

Another aspect of the present disclosure provides a semiconductor device. The semiconductor device includes a semiconductor substrate, and two fin structures formed on the semiconductor substrate. The two fin structures are adjacent to each other in an extension direction of the two fin structures. The semiconductor device includes a plurality of first dummy gate structures formed on the semiconductor substrate. Each first dummy gate structure of the plurality of first dummy gate structures is formed across a fin structure of the two fin structures. The semiconductor device also includes a trench isolation layer separating the two fin structures, and a plurality of source/drain doped regions formed in the two fin structures. The trench isolation layer is located between two adjacent first dummy gate structures that are respectively formed across the two fin structures, and on each side of a first dummy gate structure of the plurality of first dummy gate structures, a source/drain doped region of the plurality of source/drain doped regions is formed. The semiconductor device further includes an interlayer dielectric layer formed on the plurality of first dummy gate structures. The interlayer dielectric layer covers a portion of the semiconductor substrate and the two fin structures adjacent to the trench isolation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In current technology, the performance of semiconductor devices may still need to be improved. FIGS. 1-4 illustrate schematic views of semiconductor structures at certain stages of a fabrication process of a semiconductor device.

Figure 1:
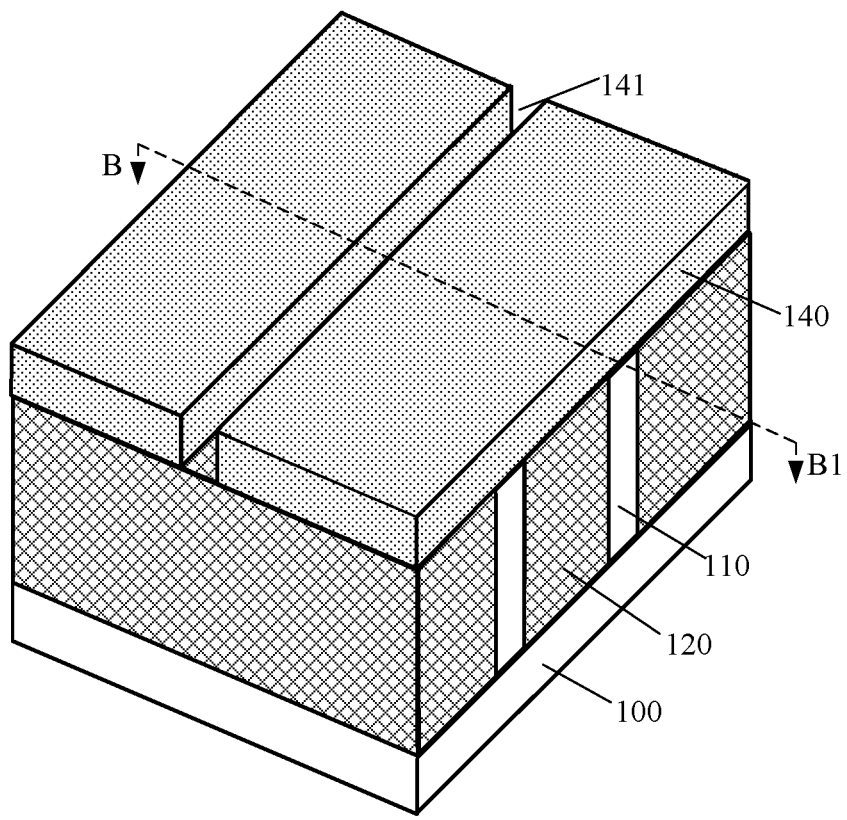
FIGS. 1-4 illustrate schematic views of semiconductor structures at certain stages of a fabrication process of a semiconductor device.
Figure 2:
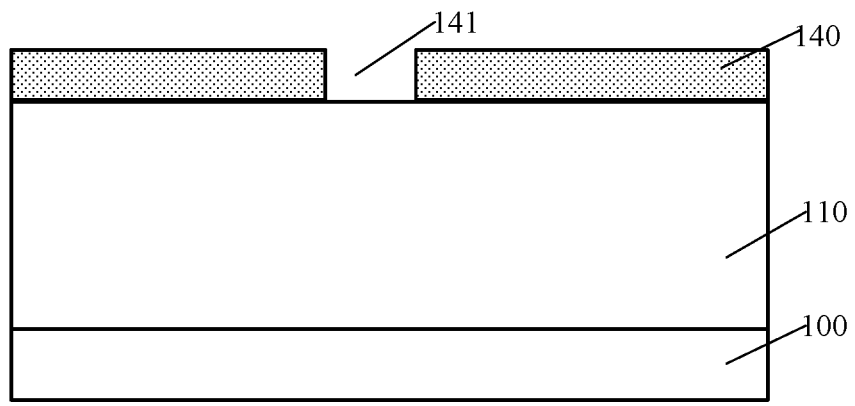

FIG. 1 illustrate a schematic three-dimensional view of a semiconductor structure during the fabrication process of the semiconductor device, and FIG. 2 illustrates a schematic cross-sectional view of the semiconductor structure shown in FIG. 1 in a B-B1 line. Referring to FIGS. 1-2, a semiconductor substrate 100 is provided. A plurality of initial fin structures 110 is formed on the semiconductor substrate 100. An isolation-structure film 120 is formed on the semiconductor substrate 100, and the isolation-structure film 120 covers the sidewall surfaces of the plurality of initial fin structures 110. A mask layer 140 is formed on the plurality of initial fin structures 110 and the isolation-structure film 120. An opening 141 is formed in the mask layer 140, and in the direction perpendicular to the top surface of the semiconductor substrate 100, the opening 141 penetrates through the mask layer to expose a portion of the top surfaces of the plurality of initial fin structures 110 as well as a portion of the top surface of the isolation-structure film 120.

Figure 3:
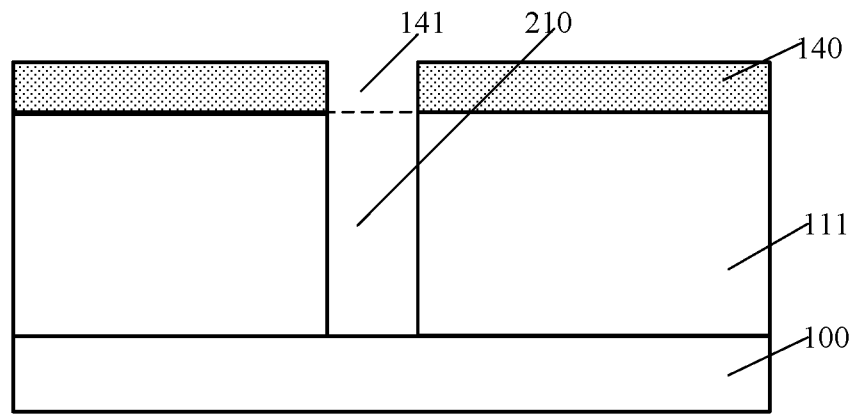

Referring to FIG. 3, the plurality of initial fin structures 110 and the isolation-structure film 120 are etched along the opening 141 by using the mask layer 140 as a mask. A trench 150 is thus formed in the plurality of initial fin structures 110 and the isolation-structure film 120. The trench 150 divide each initial fin structure 110 to form two fin structures 111. That is, two fin structures 111 may be formed on the two sides of the trench 150, respectively.

Figure 4:
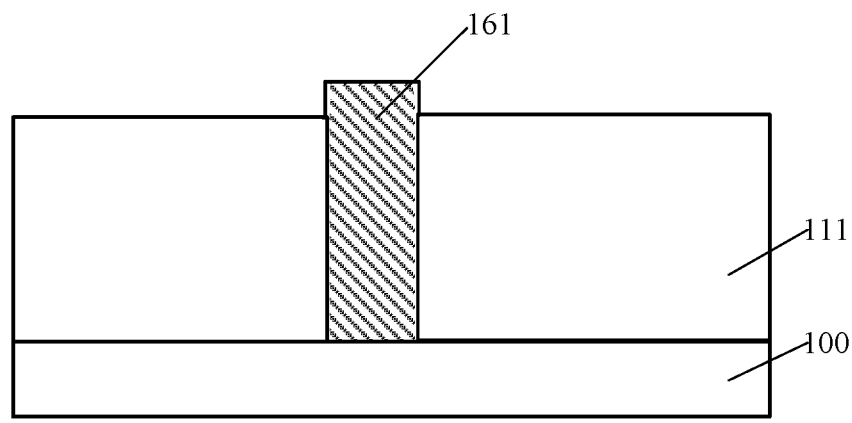

Referring to FIG. 4, an isolation-layer film 161 is formed in the trench 150 and the opening 141, and after forming the isolation-layer film 161 in the trench 150 and the initial fin structure 110, the mask layer 140 is then removed.

After removing the mask layer, the isolation-layer film and the isolation-structure film are etched back such that the isolation-film layer forms an isolation layer and the isolation-structure film forms an isolation structure. The top surface of the isolation layer is higher than or leveled with the top surfaces of the fin structures, and the top surface of the isolation structure is lower than the top surfaces of the fin structures.

In order to form the isolation layer, forming the isolation-structure film 120 is necessary. Therefore, an additional process is required to form the isolation-structure film 120. In addition, etching back the isolation-layer film and the isolation-structure film is also required. As such, the process of forming the isolation layer is complicated.

The present disclosure provides a method for forming semiconductor devices. The method includes etching and removing a second dummy-gate-structure body and an initial fin structure under the second dummy-gate-structure body to form a trench in the initial fin structure with the trench dividing the initial fin structure to form two fin structures that are respectively located on the two sides of the trench; forming an interlayer dielectric layer on a first dummy gate structure and also on the portion of the semiconductor substrate and the fin structures adjacent to the trench. During the formation of the interlayer dielectric layer, the method also includes forming a trench isolation layer in the trench. The method according to the present disclosure simplifies the fabrication process.

Figure 9:
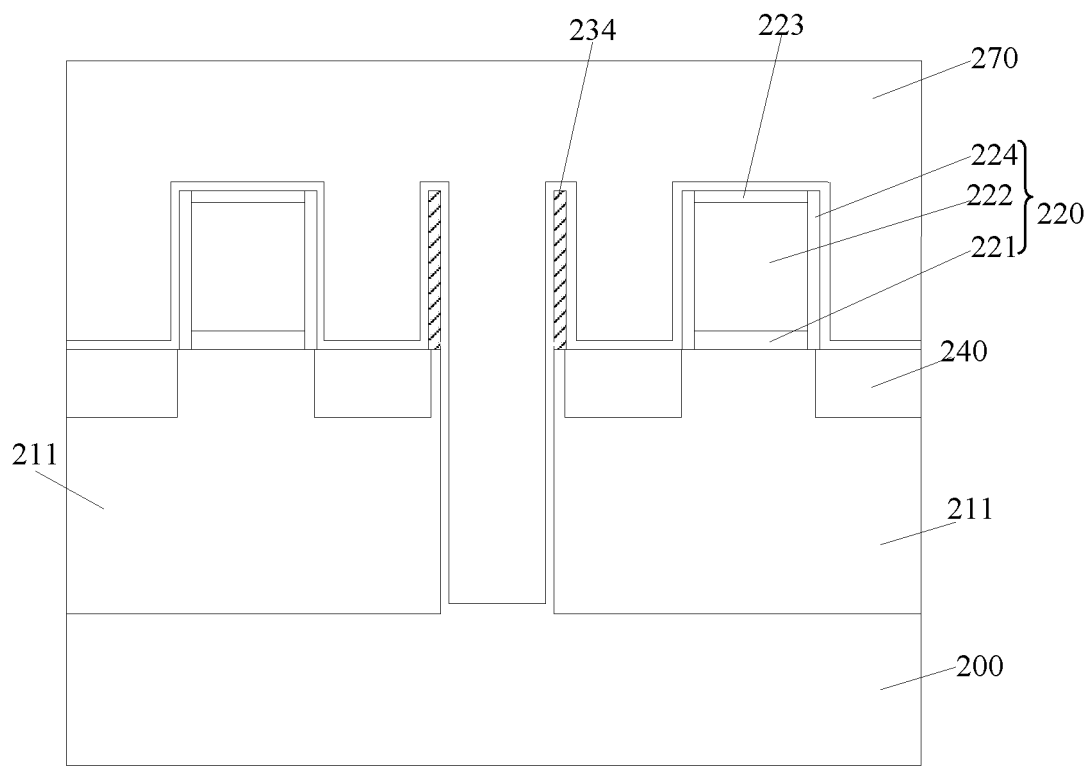
Figure 10:
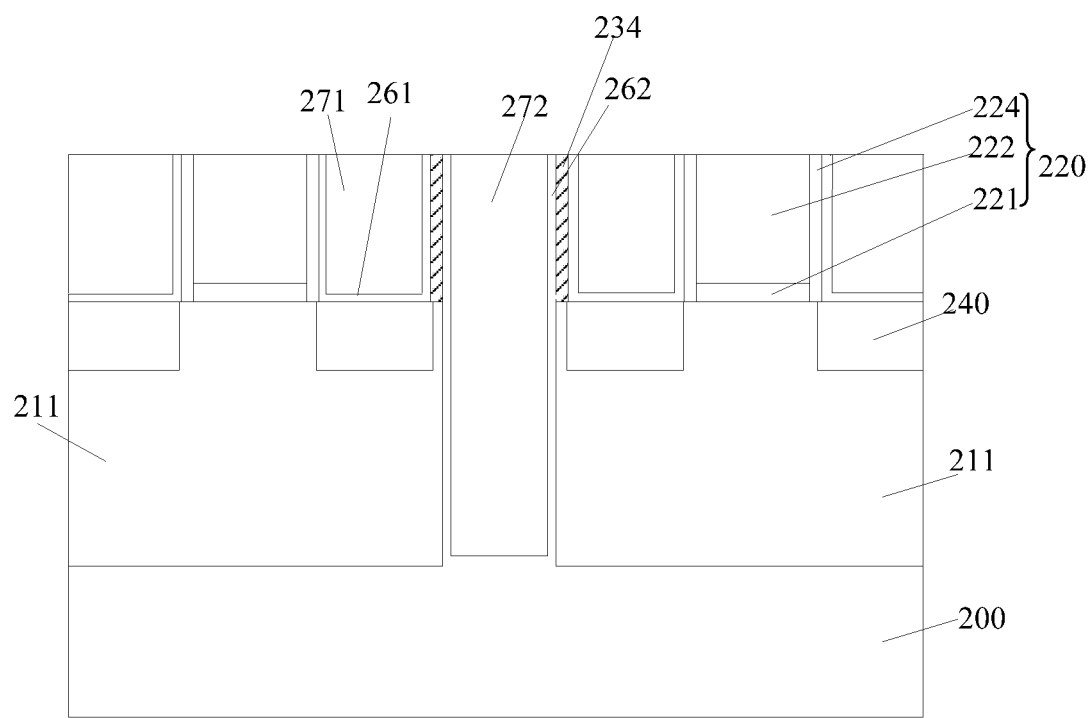
Figure 11:
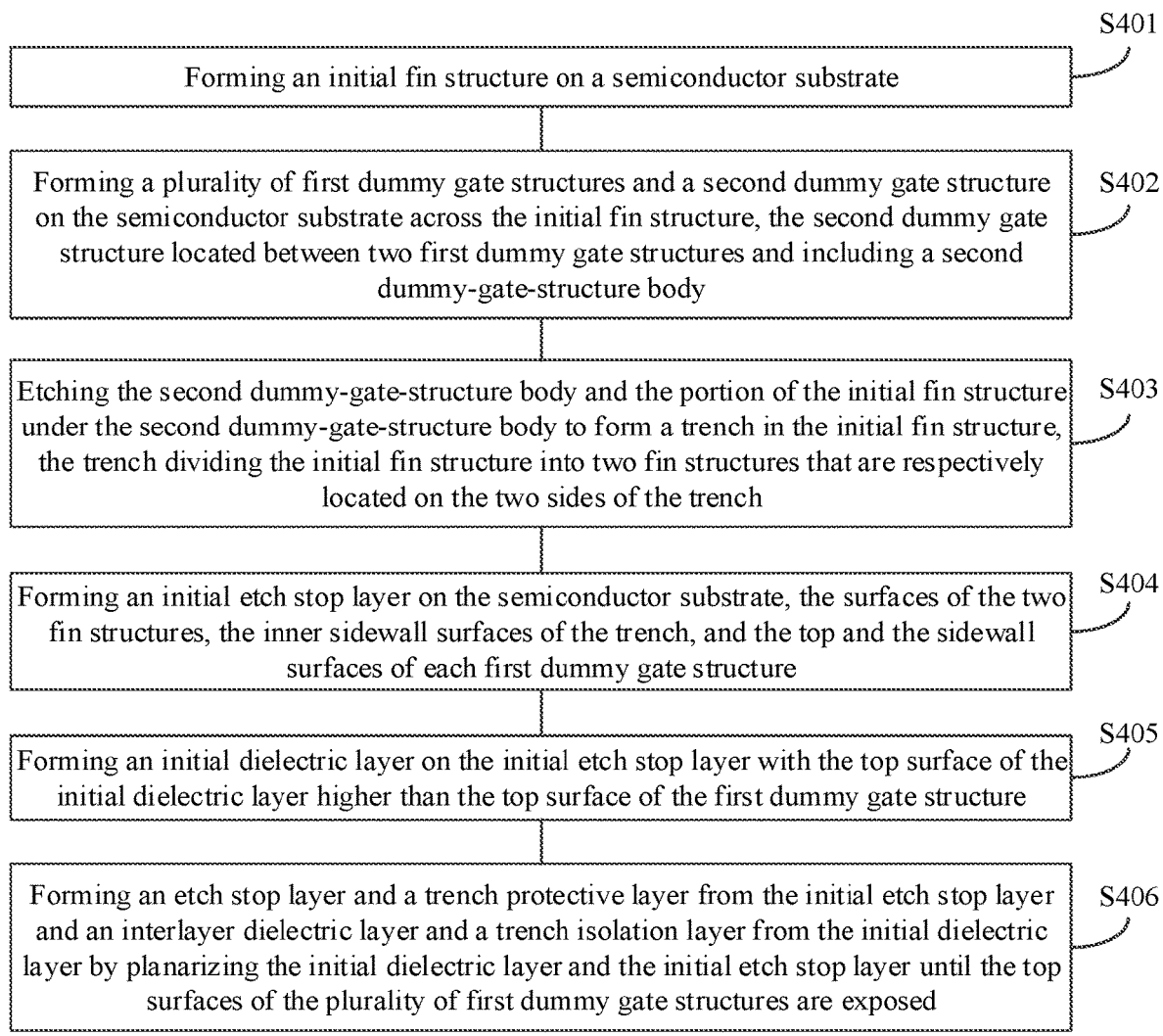
FIG. 11 illustrates a flowchart of an exemplary method for fabricating a semiconductor device consistent with various embodiments of the present disclosure.

FIG. 11 illustrates a flowchart of an exemplary method for fabricating a semiconductor device consistent with various embodiments of the present disclosure. FIGS. 5-10 illustrate schematic views of semiconductor structures at certain stages of the exemplary method.

Figure 5:
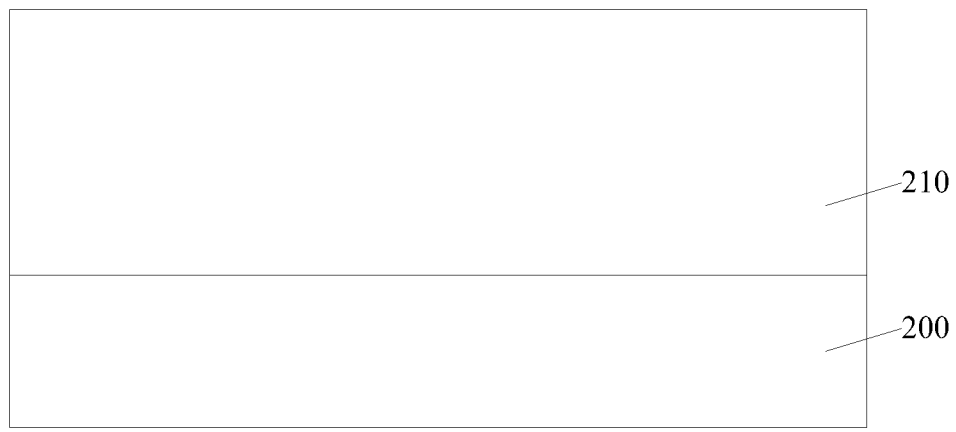
FIGS. 5-10 illustrate schematic views of semiconductor structures at certain stages of an exemplary method for fabricating a semiconductor device consistent with some embodiments of the present disclosure.

Referring to FIG. 11, a semiconductor substrate may be provided, and an initial fin structure may be formed on the semiconductor substrate (S401). FIG. 5 illustrates a schematic cross-sectional view of a semiconductor structure consistent with various embodiments of the present disclosure.

Referring to FIG. 5, a semiconductor substrate 200 may be provided, and an initial fin structure 210 may be formed on the semiconductor substrate 200. The semiconductor substrate 200 may be used to provide a process platform for subsequent formation of a semiconductor device.

In one embodiment, the semiconductor substrate 200 may be made of single-crystalline silicon. In other embodiments, the semiconductor substrate may be made of polycrystalline silicon or amorphous silicon. Alternatively, the semiconductor substrate may be made of germanium, SiGe, GaAs, and other appropriate semiconductor materials or structures.

In one embodiment, the initial fin structure 210 may be formed by patterning the semiconductor substrate 200. In other embodiments, the initial fin structure may be formed by a method including forming a fin-structure material layer on the semiconductor substrate, and then patterning the fin-structure material layer to form the initial fin structure.

In one embodiment, an isolation structure (not shown) may also be formed on the semiconductor substrate 200. The isolation structure may cover a portion of the sidewall surfaces of the initial fin structure. The top surface of the isolation structure may be lower than the top surface of the initial fin structure. The isolation structure may be made of a material including silicon oxide.

Figure 6:
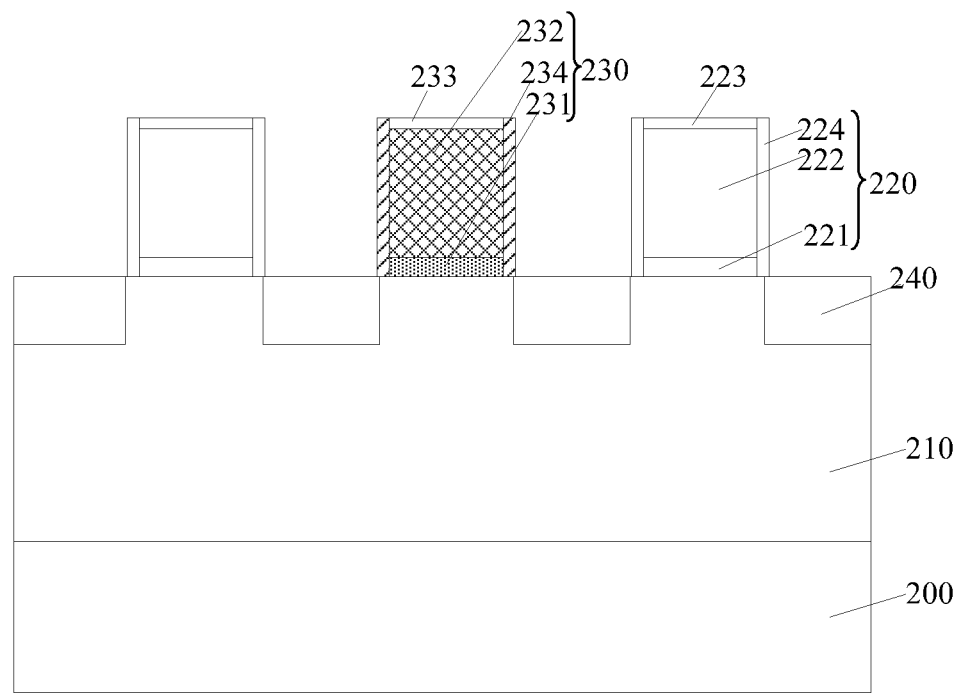

Further, returning to FIG. 11, a plurality of first dummy gate structures and a second dummy gate structure may be formed across the initial fin structure, and the second dummy gate structure may be formed between two first dummy gate structures and may include a second dummy-gate-structure body (S402). FIG. 6 illustrates a schematic cross-sectional view of a semiconductor structure consistent with various embodiments of the present disclosure.

Referring to FIG. 6, a plurality of first dummy gate structures 220 and a second dummy gate structure 230 may be formed. Each first dummy gate structure 220 and the second dummy gate structure 230 may be formed across the initial fin structure 210. The second dummy gate structure 230 may be formed between two first dummy gate structures 220, and may include a second dummy-gate-structure body. That is, a first dummy gate structure 220 may be disposed on each side of the second dummy gate structure 230.

It should be noted that when fabricating a semiconductor device, the number of the second dummy gate structure formed across the initial fin structure may be more than one. However, each second dummy gate structure may be formed between two first dummy gate structures, and the fabrication method for the portion of the semiconductor device adjacent to each second dummy gate structure may be consistent with various embodiments according to the present disclosure. Therefore, the second dummy gate structure shown in FIG. 6 is described as an example for illustrating the disclosed fabrication method.

The plurality of first dummy gate structures 220 and the second dummy gate structure 230 may be separated from each other. That is, the plurality of first dummy gate structures 220 may not be connected to each other and the second dummy gate structure 230 may not be connected to any first dummy gate structure 220 of the plurality of first dummy gate structures 220. In one embodiment, the first dummy gate structure 220 may also be formed on a portion of the isolation structure.

In one embodiment, each first dummy gate structure 220 may include a first dummy-gate-structure body and a first sidewall spacer 224 formed on each sidewall surface of the first dummy-gate-structure body. That is, each first sidewall spacer 224 may be formed on one of the two sidewall surfaces of the first dummy-gate-structure body in the extension direction of the initial fin structure 210.

In one embodiment, a first gate mask layer 223 may be formed on the top surfaces of the first dummy gate structures 220. For example, the first gate mask layer 223 may be formed on the top surface of each first dummy-gate-structure body. Each first sidewall spacer 224 may be formed on a sidewall surface of the first dummy-gate-structure body and a sidewall surface of the first gate mask layer 223. In other embodiments, the first gate mask layer may not be formed on the top surfaces of the first dummy gate structures.

In one embodiment, the first dummy-gate-structure body may be formed across the initial fin structure 210, and may cover a portion of the top and sidewall surfaces of the initial fin structure 210. The first dummy-gate-structure body may include a first dummy gate dielectric layer 221 and a first dummy gate electrode layer 222 formed on the first dummy gate dielectric layer 221. The first dummy gate dielectric layer 221 may cover a portion of the top and sidewall surfaces of the initial fin structure 210. The first dummy gate dielectric layer 221 may be made of silicon oxide or a high-k dielectric material (a material with a relative dielectric constant greater than 3.9). The first dummy gate electrode layer 222 may be made of polycrystalline silicon.

The second dummy gate structure 230 may include a second dummy-gate-structure body and a second sidewall spacer 234 formed on each sidewall surface of the second dummy-gate-structure body. That is, each second sidewall spacer 234 may be formed on one of the two sidewall surfaces of the second dummy-gate-structure body in the extension direction of the initial fin structure 210. In one embodiment, the second dummy gate structure 230 may also be formed on a portion of the isolation structure.

In one embodiment, a second gate mask layer 233 may be formed on the top surface of the second dummy gate structure 230. For example, the second gate mask layer 233 may be formed on the top surface of the second dummy-gate-structure body. Each second sidewall spacer 234 may be formed on a sidewall surface of the second dummy-gate-structure body and a sidewall surface of the second gate mask layer 233. In other embodiments, the top surface of the second dummy gate structure may not be covered by a second gate mask layer.

In one embodiment, the second dummy-gate-structure body may be formed across the initial fin structure 210, and may cover a portion of the top and sidewall surfaces of the initial fin structure 210. The second dummy-gate-structure body may include a second dummy gate dielectric layer 231 and a second dummy gate electrode layer 232 formed on the second dummy gate dielectric layer 231. The second dummy gate dielectric layer 231 may cover a portion of the top and sidewall surfaces of the initial fin structure 210. The second dummy gate dielectric layer 231 may be made of silicon oxide or a high-k dielectric material (a material with a relative dielectric constant greater than 3.9). The second dummy gate electrode layer 232 may be made of polycrystalline silicon.

In one embodiment, the plurality of first dummy gate structures 220 and the second dummy gate structure 230 may be formed in a same fabrication process. That is, the second dummy gate structure 230 may be formed during the process of forming the plurality of first dummy gate structures 220. Therefore, without introducing any additional process, fabrication of the plurality of first dummy gate structures 220 and the second dummy gate structure 230 can be realized.

The corresponding materials in the first dummy gate structure 220 and in the second dummy gate structure 230 may have same characteristic dimensions. For example, the characteristic dimensions of the first dummy gate dielectric layer 221 may be the same as the characteristic dimensions of the second dummy gate dielectric layer 231, and the characteristic dimensions of the first dummy gate electrode layer 222 may be the same as the characteristic dimensions of the second dummy gate electrode layer 232.

The second dummy-gate-structure body in the second dummy gate structure 230 may define the position of a corresponding trench isolation layer formed in a subsequent process.

In one embodiment, the distance between two adjacent first dummy gate structures 220 may be equal to the distance between a second dummy gate structure 230 and a first dummy gate structure 220 adjacent to the second dummy gate structure 230. A trench isolation layer formed in a subsequent process may need to isolation the two first dummy gate structures 220 on the two sides of the trench isolation layer, and thus the distance from the first dummy gate structure 220 on one side of the trench isolation layer to the first dummy gate structure 220 on the other side of the trench isolation layer may be large. In a case where the second dummy gate structure 230 is not formed, the distance between the first dummy gate structure 220 on one side of the trench isolation layer and the first dummy gate structure 220 on the other side of the trench isolation layer may not be the same as the distance between two adjacent first dummy gate structures 220 on a same side of the trench isolation layer. Therefore, during the process of forming the first dummy gate structures 220, the pattern of the first dummy gate structure 220 close to the trench isolation layer may be degraded. However, when a second dummy gate structure 230 is formed at the position corresponding to the subsequently-formed trench isolation layer, the plurality of first dummy gate structures 220 and the second dummy gate structure 230 may together construct a plurality of dummy gate structures that is periodically arranged in space, such that during the process of forming the plurality of dummy gate structures, the quality of the patterns of the first dummy gate structure 220 closed to the trench isolation layer may be improved.

In one embodiment, prior to etching and removing the second dummy-gate-structure body and the portion of the initial fin structure 210 under the second dummy-gate-structure body, the method may further include forming a source/drain doped region 240 in the initial fin structure 210 on each side of the first dummy gate structure 220 and also on each side of the second dummy gate structure 230.

The plurality of first dummy gate structures 220 and the second dummy gate structure 230 may together limit the formation space for the source/drain doped region 240, such that for a source/drain doped region 240 formed between a second dummy gate structure 230 and an adjacent first dummy gate structure 220, the growth rate of the source/drain doped region 240 on the side close to the first dummy gate structure 220 may be consistent with the growth rate of the source/drain doped region on the side close to the second dummy gate structure, thereby preventing the source/drain doped region 240 from collapsing at the edges.

Figure 7:
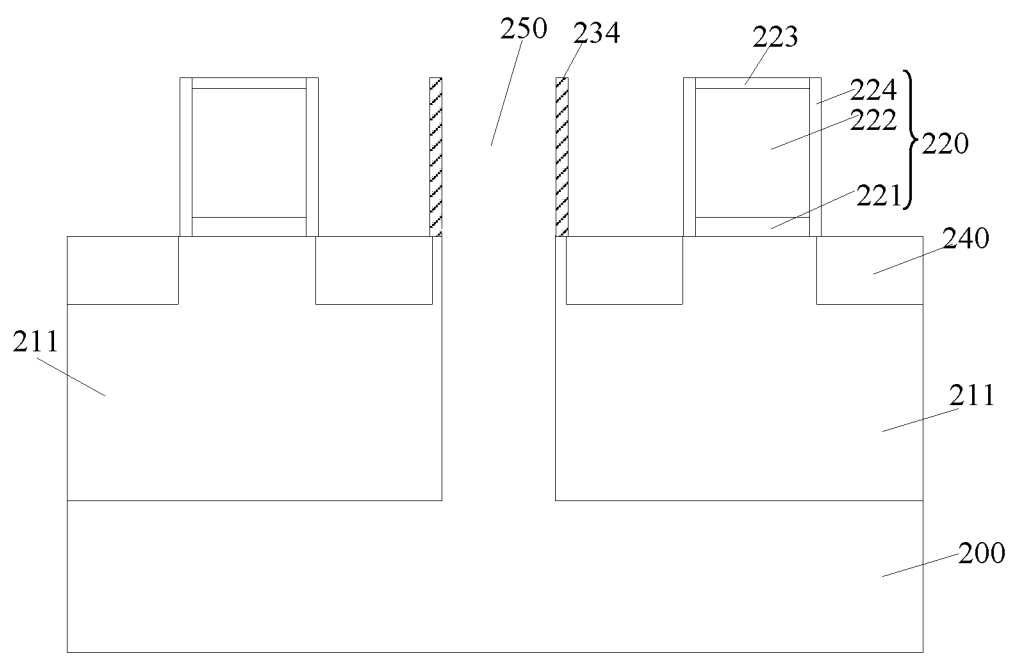

Further, returning to FIG. 11, the second dummy-gate-structure body and the portion of the initial fin structure under the second dummy-gate-structure body may be etched to form a trench in the initial fin structure with the trenching dividing the initial fin structure to form two fin structures respectively located on the two sides of the trench (S403). FIG. 7 illustrates a schematic cross-sectional view of a semiconductor structure consistent with various embodiments of the present disclosure.

Referring to FIG. 7, the second dummy-gate-structure body and the portion of the initial fin structure 210 (referring to FIG. 6) under the second dummy-gate-structure body may be removed to form a trench 250 in the initial fin structure 210. The trench may divide the initial fin structure 210 to form two fin structures 211. That is, the two fin structures 211 may be formed on the two sides of the trench 250, respectively.

In one embodiment, prior to etching and removing the second dummy-gate-structure body and the portion of the initial fin structure under the second dummy-gate-structure body, the method may further include forming a mask layer on the semiconductor substrate 200 and the initial fin structure 210 with the mask layer covering the plurality of first dummy gate structures 220 but exposing the second dummy gate structure 230; etching and removing the second dummy-gate-structure body and the portion of the initial fin structure under the second dummy-gate-structure body using the mask layer as an etch mask; and after etching and removing the second dummy-gate-structure body and the portion of the initial fin structure under the second dummy-gate-structure body, removing the mask layer.

In one embodiment, prior to etching and removing the second dummy-gate-structure body and the portion of the initial fin structure 210 under the second dummy-gate-structure body, the fabrication process may also include etching and removing the second gate mask layer 233. For example, the second gate mask layer 233 may be removed through an etching process using the mask layer as an etch mask. In one embodiment, the mask layer may be made of a photoresist.

In one embodiment, the trench 250 may penetrate through the initial fin structure 210 in the width direction of the initial fin structure 210, such that the initial fin structure 210 may be divided by the trench 250 to form two fin structures 211. That is, the two fin structures 211 may be formed on the two sides of the trench 250, respectively.

In one embodiment, the second dummy-gate-structure body, the portion of the initial fin structure 210 under the second dummy-gate-structure body, and the portion of the isolation structure formed on the bottom of the second dummy-gate-structure body may be etched and removed until the surface of the semiconductor substrate 200 is exposed. As such, the trench 250 may be formed, and the portion of the surface of the semiconductor substrate 200 may be exposed on the bottom of the trench 250.

After forming the trench 250, the isolation structure may cover a portion of the sidewall surfaces of each fin structure 211. In one embodiment, the trench 250 may further extend between the second sidewall spacers 234.

In one embodiment, during the process of etching and removing the second dummy-gate-structure body and the portion of the initial fin structure 210 under the second dummy-gate-structure body, the etching selectivity ratio of the etching rate of the second dummy-gate-structure body to the etching rate of the second sidewall spacer 234 may be in a range of approximately 20 to 100, and the etching selectivity ratio of the etching rate of the initial fin structure 210 to the etching rate of the second sidewall spacer 234 may be in a range of approximately 20 to 100. As such, the etching consumption of the second sidewall spacer 234 may be reduced.

In one embodiment, the second sidewall spacer 234 and the second gate mask layer 233 may be made of different materials. During the process of etching and removing the second gate mask layer 233, the etching rate of the second gate mask layer 233 may be larger than the etching rate of the second sidewall spacer 234. For example, during the process of etching and removing the second gate mask layer 233, the ratio of the etching rate of the second gate mask layer 233 to the etching rate of the second sidewall spacer 234 may be in a range of approximately 20 to 100. In one embodiment, the second sidewall spacer 234 may be made of a material including silicon nitride, SiON, or SiCN, and the second gate mask layer 233 may be made of a material including silicon nitride, SiON, or SiCN, but different from the material used for forming the second sidewall spacer 234. For example, when the second sidewall spacer 234 is made of silicon nitride, the second sidewall spacer 234 may be made of SiON, SiCN, or any other appropriate material different from silicon nitride. In addition, an etching process may be performed to remove the second gate mask layer 223 and the etching process may have a substantially larger etching rate on the second gate mask layer 223 than on the second sidewall spacer 234. As such, the degree of consumption of the second sidewall spacer 234 during the process of etching the second gate mask layer 233 may be reduced. That is, when performing the etching process to remove the second gate mask layer 233, the portion of the second sidewall spacer 234 that is removed may be limited.

During the etching process described above, by selecting an appropriate etching selectivity ratio, the etching consumption of the second sidewall spacer 234 may be effectively reduced. As such, the reduction of the thickness of the second sidewall spacer 234 may be small, and thus collapse of the second sidewall spacer 234 may be unlikely.

The second sidewall spacer 234 may also provide a space for a trench isolation layer formed in a subsequent process. As such, the obtained trench isolation layer may extend between the second sidewall spacers 234, and the height of the trench isolation layer may be large, thereby improving the isolation performance of the trench isolation layer.

Further, in a subsequent process, an interlayer dielectric layer may be formed on the top of the plurality of first dummy gate structures 220 and on the portion of the semiconductor substrate 200 and the fin structures 211 adjacent to the trench 250. During the process of forming the interlayer dielectric layer, a trench isolation layer may be formed in the trench 250.

In one embodiment, after forming the trench 250, the method may further include forming an etch stop layer on the top surfaces of the fin structures 211 formed on the two sides of each first dummy gate structure 220. During the process of forming the etch stop layer, a trench protective layer may be formed on the inner sidewall surfaces of the trench 250. After forming the interlayer dielectric layer and the trench isolation layer, the interlayer dielectric layer may also be formed on the etch stop layer, and the trench isolation layer may be formed on the trench protective layer. In other embodiments, the trench protective layer and/or the etch stop layer may not be formed.

In the following, an example of forming the etch stop layer, the interlayer dielectric layer, the trench isolation layer, and the trench protective layer will be provided.

Figure 8:
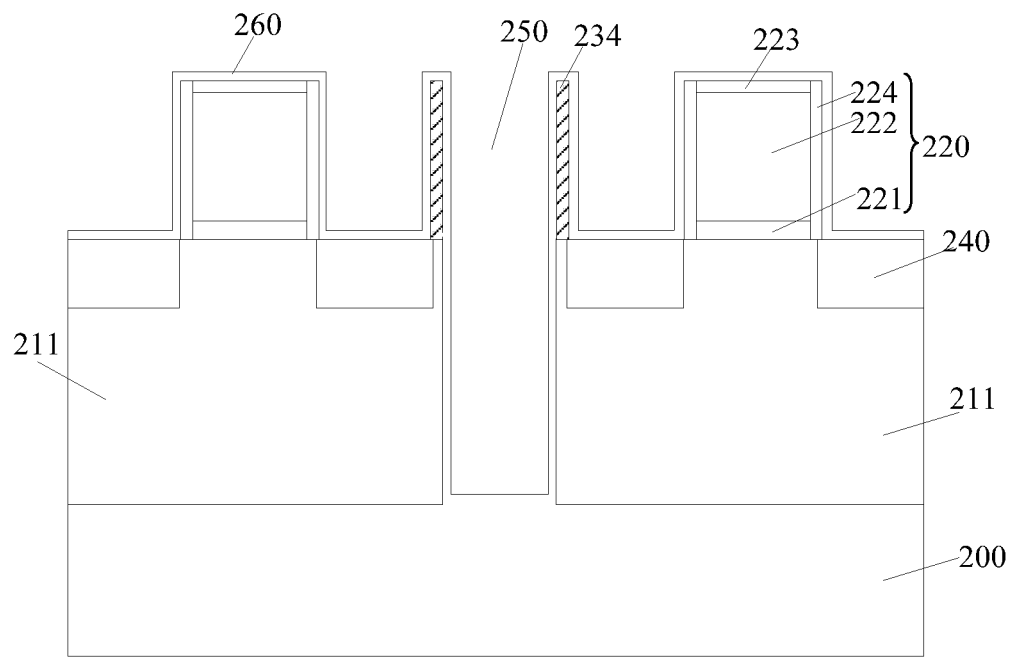

Referring to FIG. 11, an initial etch stop layer may be formed on the semiconductor substrate, the surfaces of the two fin structures, the inner sidewall surfaces of the trench, and the top and the sidewall surfaces of each first dummy gate structure (S404). FIG. 8 illustrates a schematic cross-sectional view of a semiconductor structure consistent with various embodiments of the present disclosure.

Referring to FIG. 8, an initial etch stop layer 260 may be formed on the semiconductor substrate 200, the surfaces of the two fin structures 211, the inner sidewall surfaces of the trench 250, and the top and sidewall surfaces of each first dummy gate structure 220.

The process of forming the initial etch stop layer 260 may be a deposition process, such as an atomic layer deposition (ALD) process. The thickness of an initial etch stop layer 260 formed by an ALD process may be uniform, and the film quality may be desired. As such, the thickness uniformity of the etch stop layer and the trench protective layer may be desired, and the film quality may also be desired.

In one embodiment, the thickness of the initial etch stop layer 260 may be in a range of approximately 10 Å to 30 Å, and the initial etch stop layer 260 may be made of a material including silicon nitride.

Further, returning to FIG. 11, an initial dielectric layer may be formed on the initial etch stop layer with the top surface of the initial dielectric layer higher than the top surfaces of the first dummy gate structures (S405). FIG. 9 illustrates a schematic cross-sectional view of a semiconductor structure consistent with various embodiments of the present disclosure.

Referring to FIG. 9, an initial dielectric layer 270 may be formed on the initial etch stop layer 260. The top surface of the initial dielectric layer 270 may be higher than the top surfaces of the first dummy gate structures 220. The initial dielectric layer 270 may be able to fill up the trench 250. In one embodiment, the top surface of the initial dielectric layer 270 may also be higher than the top surface of the second dummy gate structure 230.

In one embodiment, the initial dielectric layer 270 may be formed by a deposition process, such as a plasma chemical vapor deposition process.

In one embodiment, the process of forming the initial dielectric layer 270 may include the following exemplary steps. First, a first dielectric layer (not shown) may be formed on the initial etch stop layer 260. The top surface of the first dielectric layer may be higher than the top surfaces of the fin structures 211 but lower than the top surfaces of the plurality of first dummy gate structures 220. The top surface of the first dielectric layer may also be lower than the top surfaces of the plurality of second sidewall spacers 230. The first dielectric layer may be formed in the trench 250 between adjacent fin structures 211 and also in a portion of the trench 250 between adjacent second sidewall spacers. Further, a second initial dielectric layer may be formed on the first dielectric layer. The second initial dielectric layer may cover the plurality of first dummy gate structures 220 and may be formed in the trench 250 between adjacent second sidewall spacers. The second initial dielectric layer together with the first dielectric layer may form the initial dielectric layer 270.

The process of forming the first dielectric layer may be a deposition process, such as a fluid chemical vapor deposition process. By adopting a fluid chemical vapor deposition process to form the first dielectric layer, the material of the first dielectric layer may demonstrate desired filling performance. The process of forming the second initial dielectric layer may also be a deposition process, such as high-density plasma chemical vapor deposition. The hardness of the second initial dielectric layer may be higher than the hardness of the first dielectric layer.

Further, returning to FIG. 11, the initial dielectric layer and the initial etch stop layer may be planarized until the top surfaces of the plurality of first dummy gate structures are exposed, such that an etch stop layer and a trench protective layer may be formed from the initial etch stop layer and an interlayer dielectric layer and a trench isolation layer may be formed from the initial dielectric layer (S406). FIG. 10 illustrates a schematic cross-sectional view of a semiconductor structure consistent with various embodiments of the present disclosure.

Referring to FIG. 10, the initial dielectric layer 270 and the initial etch stop layer 260 may be planarized until the top surfaces of the plurality of first dummy gate structures 220 are exposed, such that an etch stop layer 261 and a trench protective layer 262 may be formed from the initial etch stop layer 260 and an interlayer dielectric layer 271 and a trench isolation layer 272 may be formed from the initial dielectric layer 270.

The etch stop layer 261 may be formed on the top surfaces of the fin structures 211 located on both sides of each first dummy gate structure 220. The etch stop layer 261 may cover the surfaces of the source/drain doped regions 240. The trench protective layer 262 may be formed on the inner sidewall surfaces of the trench 250. For example, the trench protective layer 262 may be formed on the bottom surface and the sidewall surfaces of the trench 250.

In one embodiment, the etch stop layer 261 may also be formed on the sidewall surfaces of the first dummy gate structures 220, the sidewall surfaces of the fin structures 211 in the width direction of the fin structures 211, and the sidewall surfaces of the second sidewall spacers 234 that face away from the trench 250.

In one embodiment, the etch stop layer 261 may serve as a stop layer during subsequent formation of contact holes.

In one embodiment, the trench protective layer 262 may have a desired uniform thickness, and the quality of the film layer may be high. The trench protective layer 262 may be able to repair the defects on the inner sidewall surfaces of the trench 250. Therefore, the trench protective layer 262 and the trench isolation layer 272 may together provide desired isolation and thus form a trench isolation structure in the trench 250. As such the isolation performance of the trench isolation structure may be improved.

The trench protective layer 262 may be able to reduce the presence of defects on the inner sidewall surfaces of the trench 250. For example, during the etching process for forming the trench 250, when the trench 250 exposes the source/drain doped regions 240, the trench protective layer 262 may isolate the source/drain doped regions 240, preventing direct contact between the source/drain doped regions 240 and the trench isolation layer 272.

In one embodiment, during the process of forming the etch stop layer 261, a trench protective layer 262 may be formed on the inner sidewall surfaces of the trench 250. That is, the trench protective layer 262 may be formed by the process of forming the etch stop layer 261 without requiring any additional process, which simplifies the fabrication process.

In one embodiment, the thickness of the etch stop layer 261 and the thickness of the trench protective layer 262 may be both in a range of approximately 10 Å to 30 Å. As such, the etch stop layer 261 may have a sufficiently large thickness required for satisfying the etching process and, in addition, the trench protective layer 262 may also be able to repair the defects on the inner sidewall surfaces of the trench 250 as desired. When the thickness of the trench protective layer is larger than 30 Å, the space occupied by the trench isolation layer 272 may be limited, resulting in degradation of the isolation performance of the trench isolation structure. In one embodiment, the thickness of the trench protective layer 262 may be smaller than or equal to 30 Å, such that the thickness of the trench protective layer 262 may not be overly large. Therefore, the isolation performance of the trench isolation structure formed by the trench protective layer 262 and the trench isolation structure 272 may be improved.

In one embodiment, the interlayer dielectric layer 271 may be located on the first dummy gate structure 220 and also on the portion of the semiconductor substrate 200 and the fin structures 211 adjacent to the trench 250, and the trench isolation layer 272 may be formed in the trench 250.

In one embodiment, after forming the interlayer dielectric layer 271 and the trench isolation layer 272, the interlayer dielectric layer 271 may also be formed on the etch stop layer 261, and the trench isolation layer 272 may also be formed on the trench protective layer 262.

In one embodiment, the etch stop layer 261 and the trench protective layer 262 may be made of a material including silicon nitride; the interlayer dielectric layer 271 and the trench isolation structure 272 may be made of a material including silicon oxide or a low-k dielectric material.

In one embodiment, the fabrication method may also include removing the first gate mask layer 223 during the process of planarizing the initial dielectric layer 270 and the initial etch stop layer 260.

The process of forming the initial dielectric layer 270 may include when forming the first dielectric layer and the second initial dielectric layer, planarizing the initial dielectric layer 270 and the initial etch stop layer 260 until the top surfaces of the first dummy gate structures 220 are exposed. For example, the second initial dielectric layer and the initial etch stop layer 260 may be planarized to expose the top surfaces of the first dummy gate structures 220, such that the initial etch stop layer 260 may form the etch stop layer 261 and the trench protective layer 262. In the meantime, the second initial dielectric layer may form a second dielectric layer. The portion of the second dielectric layer and the first dielectric layer in the trench may together become the trench isolation layer 272, and the portion of the second dielectric layer and the first dielectric layer outside of the trench may become the interlayer dielectric layer 271.

In one embodiment, the process of planarizing the second initial dielectric layer and the initial etch stop layer 260 may be a chemical mechanical polishing process.

In one embodiment, the hardness of the second initial dielectric layer may be large, such that during the process of planarizing the second initial dielectric layer and the initial etch stop layer 260, the interlayer dielectric layer 271 may be prevented from forming a concave top surface, and the trench isolation layer 272 may also be prevented from forming a concave top surface.

The trench isolation layer 272 may be used to electrically isolate the device structures that are located on the two sides of the trench isolation layer. In one embodiment, the trench isolation layer 272 may further extend between the second sidewall spacers 234 and the top surface of the trench isolation layer 272 may be higher than the top surfaces of the fin structures 211. The large height of the trench isolation layer 272 may be able to improve the isolation performance of the trench isolation layer 272.

After forming the trench isolation layer 272, the source/drain doped regions 240 may be located in the portion of the fin structures 211 on both sides of each first dummy gate structure 220, and also in the portion of the fin structures 211 formed between the first dummy gate structure and the trench isolation layer 272.

Further, the fabrication method may also include removing each first dummy-gate-structure body to form a gate opening in the interlayer dielectric layer; forming a metal-gate-structure body in the gate opening with the first sidewall spacer covering a corresponding sidewall surface of the metal-gate-structure body; forming a top-layer dielectric layer on the first sidewall spacer, the metal-gate-structure body, the trench isolation layer, and the interlayer dielectric layer; forming a plurality of contact holes in the top-layer dielectric layer and the interlayer dielectric layer on both sides of each metal-gate-structure body by etching the portion of the top-layer dielectric layer and the interlayer dielectric layer on both sides of the metal-gate-structure body until the etch stop layer formed on the top surfaces of the source/drain doped regions is exposed; etching the etch stop layer located on the bottom of each contact hole to expose the source/drain doped regions; and filling up each contact hole to form a plug.

Further, the present disclosure also provides a semiconductor device formed by adopting the method described above. FIG. 10 illustrates a schematic cross-sectional view of a semiconductor device consistent with various embodiments of the present disclosure.

Referring to FIG. 10, the semiconductor device may include a semiconductor substrate 200 and a plurality of fin structures 211 formed on the semiconductor substrate 200. The semiconductor device may also include a plurality of first dummy gate structures 220 with each formed across a fin structure 211. Each first dummy gate structure 220 may include a first dummy gate dielectric layer 221, a first dummy gate electrode layer 222 formed on the first dummy gate dielectric layer 221, and a first sidewall spacer 224 formed on each side of the first dummy gate structure 220 to cover the sidewall surfaces of the first dummy gate dielectric layer 221 and the first dummy gate electrode layer 222. The first dummy gate dielectric layer 221 may cover a portion of the top and sidewall surfaces of the corresponding fin structure 211. The semiconductor device may further include a source/drain doped region 240 formed in the fin structure 211 on each side of the first dummy gate dielectric layer 221.

The semiconductor device may further include a trench isolation layer 272 separating adjacent fin structures 211 in the extension direction of the fin structures 211. A trench protective layer 262 may separate the bottom of the trench isolation layer 272 from the semiconductor substrate 200. In addition, the trench protective layer 262 may also cover the sidewall surfaces of the trench isolation layer 272. Each sidewall surface of the portion of the trench protective layer 262 that exceeds the top surfaces of the fin structures 211 may be covered by a second sidewall spacer 234.

In one embodiment, the distance from the trench isolation layer 272 to one of the two adjacent first dummy gate structures 220 may be the same as the from the trench isolation layer 272 to the other first dummy gate structure 220.

In one embodiments, an interlayer dielectric layer 271 may be formed above each source/drain doped region 240, and the bottom of the interlayer dielectric layer 271 may be separated from the source/drain doped region 240 by an etch stop layer 261. The etch stop layer 261 may also cover the sidewall surface of the corresponding first sidewall spacer 224 and/or the sidewall surface of the corresponding second sidewall spacer 234.

In one embodiment, a trench protective layer 262 may be formed. The trench protective layer 262 may separate the trench isolation layer 272 from the semiconductor substrate 200 and may cover the sidewall surfaces of the trench isolation layer 272.

Compared to existing semiconductor devices and fabrication methods, the disclosed semiconductor device and fabrication method may demonstrate the following exemplary advantages.

According to the disclosed semiconductor device and fabrication method, the first dummy gate structure and the second dummy gate structure can be formed in a same fabrication process. Therefore, without introducing any additional process, fabrication of the first dummy gate structure and the second dummy gate structure can be realized. The second dummy-gate-structure body in the second dummy gate structure is able to define the position of the trench isolation layer. A trench is formed by removing the second dummy-gate-structure body and the portion of the initial fin structure under the second dummy-gate-structure body. The trench provides a space for subsequent formation of a trench isolation layer, and the trench isolation layer may be used to electrically isolate the circuit devices on the two sides of the trench isolation layer. The trench isolation layer is formed during the formation of an inter-layer dielectric layer. Therefore, the trench isolation layer can be formed by the process of forming the interlayer dielectric layer without requiring any additional process, which simplifies the fabrication process.

Further, an etch stop layer is formed. The etch stop layer serves as a stop layer for the subsequent formation of contact holes. During the process of forming the etch stop layer, a trench protective layer is formed on the inner sidewall surfaces of the trench. The trench protective layer is formed during the process of forming the etch stop layer without requiring any additional process, which simplifies the fabrication process. Moreover, the trench protective layer is also be able to repair the defects on the inner sidewall surfaces of the trench. Therefore, the trench protective layer and the trench isolation layer may together provide protection and thus form a trench isolation structure in the trench. As such the isolation performance of the trench isolation structure may be improved.

Further, prior to etching and removing the second dummy-gate-structure body and the portion of the initial fin structure under the second dummy-gate-structure body, a plurality of source/drain doped regions is formed in the initial fin structure on both sides of each first dummy gate structure and both sides of the second dummy gate structure. The first dummy gate structure and the second dummy gate structure together define the space for forming the source/drain doped regions, such that for the portion of the source/drain doped region located between the first dummy gate structure and the second dummy gate structure, the growth rate in the source/drain doped region that is close to the first dummy gate structure may be consistent with the growth rate in the source/drain doped region that is close to the second dummy gate structure, thereby preventing the source/drain doped region from collapsing. After forming the trench isolation layer, the source/drain doped regions may be located in the fin structure on both sides of each first dummy gate structure, and in the fin structure between the first dummy gate structure and the trench isolation layer. As such, for the portion of the source/drain doped region located between the first dummy gate structure and the trench isolation layer, collapse of the source/drain doped region close to the edges of the trench isolation layer may be prevented.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   forming an initial fin structure on a semiconductor substrate;
   forming a plurality of first dummy gate structures and a second dummy gate structure across the initial fin structure, wherein the second dummy gate structure includes a second sidewall spacer formed on each sidewall surface of the second dummy-gate-structure body in an extension direction of the initial fin structure, the second dummy gate structure is formed between two adjacent first dummy gate structures of the plurality of first dummy gate structures, and the second dummy gate structure includes a second dummy-gate-structure body;
   etching and removing the second dummy-gate-structure body and a portion of the initial fin structure under the second dummy-gate-structure body to form a trench in the initial fin structure, wherein the trench divides the initial fin structure to form two fin structures;
   forming a protective layer on both side surfaces of each second sidewall spacer and inner sidewall surfaces of the trench; and
   forming a trench isolation layer in the trench on the protective layer and an interlayer dielectric layer on the plurality of first dummy gate structures, wherein the interlayer dielectric layer covers a portion of the semiconductor substrate and the two fin structures adjacent to the trench.

2. The method according to claim 1, wherein:
the interlayer dielectric layer and the trench isolation layer are made of a material including silicon oxide or a low-k dielectric material.

3. The method according to claim 1, wherein:
the trench also extends between adjacent second sidewall spacers; and
the trench isolation layer also extends between adjacent second sidewall spacer, wherein a top surface of the trench isolation layer is higher than the top surfaces of the two fin structures.

4. The method according to claim 1, further including:
forming an isolation structure on the semiconductor substrate prior to forming the plurality of first dummy gate structures and the second dummy gate structure, wherein:
   the isolation structure covers a portion of sidewall surfaces of the initial fin structure, and
   the plurality of first dummy gate structures and the second dummy gate structure are located on a portion of the isolation structure; and
when etching and removing the second dummy-gate-structure body and the portion of the initial fin structure under the second dummy-gate-structure body, etching and removing a portion of the isolation structure under the second dummy-gate-structure body to form the trench in the initial fin structure until a top surface of the semiconductor substrate is exposed, wherein:
   after forming the trench, the isolation structure covers a portion of sidewall surfaces of the two fin structures.

5. The method according to claim 1, wherein:
prior to etching and removing the second dummy-gate-structure body and the portion of the initial fin structure under the second dummy-gate-structure body, the method further includes forming a mask layer on the semiconductor substrate and the initial fin structure, wherein the mask layer covers the plurality of first dummy gate structures and exposes the second dummy gate structure;

the mask layer is used as an etch mask to etch and remove the second dummy-gate-structure body and the portion of the initial fin structure under the second dummy-gate-structure body; and after etching and removing the second dummy-gate-structure body and the portion of the initial fin structure under the second dummy-gate-structure body, the mask layer is removed.

6. The method according to claim 1, wherein:

the second dummy-gate-structure body includes a second dummy gate dielectric layer and a second dummy gate electrode layer formed on the second dummy dielectric layer, wherein:

the second dummy dielectric layer is made of silicon oxide or a high-k dielectric material, and the second dummy electrode layer is made of polycrystalline silicon.

7. The method according to claim 1, prior to etching and removing the second dummy-gate-structure body and the portion of the initial fin structure under the second dummy-gate-structure body, further including:

forming a plurality of source/drain doped regions in the initial fin structure on both sides of each first dummy gate structure of the plurality of first dummy gate structures and on both sides of the second dummy gate structure, wherein:

after forming the trench isolation layer, the plurality of source/drain doped regions is disposed in the two fin structures located between adjacent first dummy gate structures and also in the two fin structures located between each first dummy gate structure and the trench isolation layer.

8. The method according to claim 1, wherein:

the two adjacent first dummy gate structures have a same distance to the second dummy gate structure.

9. A method for fabricating a semiconductor device, comprising:

forming an initial fin structure on a semiconductor substrate;

forming a plurality of first dummy gate structures and a second dummy gate structure across the initial fin structure, wherein the second dummy gate structure is formed between two adjacent first dummy gate structures of the plurality of first dummy gate structures, and the second dummy gate structure includes a second dummy-gate-structure body;

etching and removing the second dummy-gate-structure body and a portion of the initial fin structure under the second dummy-gate-structure body to form a trench in the initial fin structure, wherein the trench divides the initial fin structure to form two fin structures;

forming a trench isolation layer in the trench and an interlayer dielectric layer on the plurality of first dummy gate structures, wherein the interlayer dielectric layer covers a portion of the semiconductor substrate and the two fin structures adjacent to the trench; and after forming the trench, forming an etch stop layer on top surfaces of the two fin structures on both sides of each first dummy gate structure of the plurality of first dummy gate structures, wherein:

when forming the etch stop layer, a trench protective layer is formed on inner sidewall surfaces of the trench; and after forming the interlayer dielectric layer and the trench isolation layer, the interlayer dielectric layer is located on the etch stop layer, and the trench isolation layer is located on the trench protective layer.

10. The method according to claim 9, wherein forming the etch stop layer, the interlayer dielectric layer, the trench isolation layer, and the trench protective layer includes:

forming an initial etch stop layer on the semiconductor substrate to cover top and sidewall surfaces of the two fin structures, the inner sidewall surfaces of the trench, top and sidewall surfaces of the plurality of first dummy gate structures;

forming an initial dielectric layer on the initial etch stop layer, wherein a top surface of the initial dielectric layer is higher than top surfaces of the plurality of first dummy gate structures, and the initial dielectric layer fills up the trench; and planarizing the initial dielectric layer and the initial etch stop layer until the top surfaces of the plurality of first dummy gate structures are exposed, such that the initial etch stop layer forms the etch stop layer and the trench protective layer, and the initial dielectric layer forms the interlayer dielectric layer and the trench isolation layer.

11. The method according to claim 10, wherein:

a process for forming the initial etch stop layer includes an atomic layer deposition (ALD) process.

12. The semiconductor device according to claim 9, wherein:

the etch stop layer and the trench protective layer are made of a material including silicon nitride.

13. The semiconductor device according to claim 9, wherein:

a thickness of the etch stop layer and the trench protective layer is in a range of approximately 10 Å to 30 Å.

14. The method according to claim 9, wherein:

the etch stop layer and the trench protective layer are made of a material including silicon nitride.

15. The method according to claim 9, wherein:

a thickness of the etch stop layer and the trench protective layer is in a range of approximately 10 Å to 30 Å.

16. The method according to claim 9, wherein:

the interlayer dielectric layer and the trench isolation layer are made of a material including silicon oxide or a low-k dielectric material.

17. The method according to claim 9, wherein:

the second dummy gate structure further includes a second sidewall spacer formed on each sidewall surface of the second dummy-gate-structure body in an extension direction of the initial fin structure;

the trench also extends between adjacent second sidewall spacers; and the trench isolation layer also extends between adjacent second sidewall spacer, wherein a top surface of the trench isolation layer is higher than the top surfaces of the two fin structures.

18. A semiconductor device, comprising:

a semiconductor substrate;

two fin structures formed on the semiconductor substrate, wherein the two fin structures are adjacent to each other in an extension direction of the two fin structures;

a plurality of first dummy gate structures formed on the semiconductor substrate, wherein each first dummy gate structure of the plurality of first dummy gate structures is formed across a fin structure of the two fin structures;

a trench isolation layer separating the two fin structures, wherein the trench isolation layer is located between two adjacent first dummy gate structures that are respectively formed across the two fin structures;

a plurality of source/drain doped regions formed in the two fin structures, wherein on each side of a first dummy gate structure of the plurality of first dummy gate structures, a source/drain doped region of the plurality of source/drain doped regions is formed; and an interlayer dielectric layer formed on the plurality of first dummy gate structures, wherein the interlayer dielectric layer covers a portion of the semiconductor substrate and the two fin structures adjacent to the trench isolation layer, wherein:

each first dummy gate structure of the plurality of first dummy gate structures includes a first dummy gate dielectric layer formed on the semiconductor substrate and covering a portion of top and sidewall surfaces of the fin structure, a first dummy gate electrode layer formed on the first dummy gate dielectric layer, and a first sidewall spacer formed on each side of the first dummy gate structure to cover sidewall surfaces of the first dummy gate dielectric layer and the first dummy gate electrode layer;

an etch stop layer separating the interlayer dielectric layer from the plurality of source/drain doped regions and covering sidewall surfaces of the first sidewall spacer.

19. The semiconductor device according to claim 18, wherein:

the two adjacent first dummy gate structures have a same distance to the trench isolation layer.

20. The semiconductor device according to claim 18, further including:

a trench protective layer separating the trench isolation layer from the semiconductor substrate and covering sidewall surfaces of the trench isolation layer.

* * * * *